United States Patent [19]

McMahill et al.

[11] Patent Number: 5,737,694
[45] Date of Patent: Apr. 7, 1998

[54] HIGHLY STABLE FREQUENCY SYNTHESIZER LOOP WITH FEEDFORWARD

[75] Inventors: Daniel R. McMahill, Tucker; Thomas C. Whitehouse, Suwanee, both of Ga.

[73] Assignee: Scientific-Atlanta, Inc., Norcross, Ga.

[21] Appl. No.: 565,313

[22] Filed: Nov. 30, 1995

[51] Int. Cl.⁶ .................................................. H04B 1/40
[52] U.S. Cl. .......................... 455/76; 455/183.1; 455/260; 455/264; 331/2; 375/376
[58] Field of Search .......................... 455/75, 76, 77, 455/183.1, 183.2, 208, 209, 165.1, 255–260, 264, 265, 316; 331/2, 10; 327/147, 156; 375/376

[56] References Cited

U.S. PATENT DOCUMENTS

| | | | |
|---|---|---|---|
| 4,117,405 | 9/1978 | Martinez | 455/51.1 |
| 4,180,783 | 12/1979 | Khalifa | 331/2 |
| 4,742,566 | 5/1988 | Nordholt et al. | 455/260 |
| 4,743,867 | 5/1988 | Smith | 332/16 R |
| 4,748,425 | 5/1988 | Heck | 332/19 |
| 4,755,774 | 7/1988 | Heck | 332/18 |
| 4,837,853 | 6/1989 | Heck | 455/208 |
| 4,864,252 | 9/1989 | Heck | 331/1 A |
| 5,079,526 | 1/1992 | Heck | 332/127 |
| 5,109,531 | 4/1992 | Heck | 455/47 |
| 5,392,003 | 2/1995 | Nag et al. | 330/254 |

*Primary Examiner*—Reinhard J. Eisenzopf
*Assistant Examiner*—Lee Nguyen
*Attorney, Agent, or Firm*—Kenneth M. Massaroni; John Victor Pezdek

[57] ABSTRACT

A frequency synthesizer loop includes a first voltage controlled oscillator and a first divider circuit for dividing a frequency of an output signal generated by the first voltage controlled oscillator by a factor of N. The synthesizer loop further includes a phase/frequency detector circuit, a loop filter circuit, a summing circuit, a feedforward amplifier, a second voltage controlled oscillator, and a second divider circuit, wherein the second divider circuit divides a frequency of a second output signal generated by the second voltage controlled oscillator by a factor of M. The synthesizer loop also includes a microprocessor for varying the value M in response to a voltage input, such that the microprocessor varies the value of M to keep the first voltage in the middle of a range of the second voltage controlled oscillator.

12 Claims, 5 Drawing Sheets

HIGHLY STABLE FREQUENCY SYNTHESIZER LOOP WITH FEEDFORWARD

FIELD OF THE INVENTION

The present invention relates generally to the field of voltage controlled oscillator design and more particularly to a highly stable frequency synthesizer loop for such oscillators providing a highly stable tuning window and a high modulation bandwidth using phase locked techniques. The present invention further relates to a highly stable synthesizer loop for use in satellite and land-based microwave receiver tuners and clock recovery circuits.

BACKGROUND OF THE INVENTION

A typical block diagram for one type of known satellite QPSK receiver 101 is shown in FIG. 1. The incoming QPSK carrier is in the 950–1450 MHZ range of frequencies. The tuner employs a synthesized local oscillator (LO) 102 and mixer 103 to select the desired channel and produce a first intermediate frequency (IF) of 810 MHZ. The signal centered at 810 MHZ is filtered by filter 104 and mixed with an 880 MHZ LO 105 in mixer 106 to produce the final IF of 70 MHZ. The final IF signal is filtered by filter 107 and then demodulated with a quadrature demodulator (shown as 108, 109, 110, 111, and 112). The demodulated in-phase, I, and quadrature, Q, signals are used by the carrier recovery phase detector circuit 113 to determine the phase error between the 70 MHZ LO and the incoming 70 MHZ IF signal. The phase error is integrated by the loop filter 114 and sent to the control input of the 880 MHZ voltage controlled oscillator (VCO) 105. The feedback signal pushes the system toward a locked condition where the phase error is zero. The carrier recovery phase detector 113 can be a standard 4-phase Costas Loop type detector.

The system shown in FIG. 1 suffers from the following problem. The 880 MHZ VCO 105 has conflicting constraints on its design. In applications where the bandwidth occupied by the carrier is only a fraction of that of a satellite transponder, it is desirable to limit the tuning range of the VCO 105. Limiting the tuning range helps prevent problems with the Costas Loop false locking on the correct carrier or locking on the wrong carrier. The tuning range needs to be large enough, however, to compensate for drifts in the incoming carrier frequency. For example, a low noise block down converter (not shown) used to convert the incoming signal to an L-Band frequency may exhibit a drift of several MHZ with temperature changes.

To operate effectively, the 880 MHZ VCO 105 in FIG. 1 requires a tuning range of ±2.5 MHZ. If this 5 MHZ tuning window is to remain centered at 880 MHZ with only a 500 kHz drift, then a VCO with a stability of about 0.05% or around 500 parts per million (ppm) is required. This level of stability is difficult, if not impossible, to achieve over the required temperature range with a varactor-tuned LC oscillator.

Other applications of VCOs have similar requirements. For example, FIG. 4 shows a known configuration of a phase locked loop clock recovery circuit. The phase of the incoming data is compared to the phase of a voltage controlled crystal oscillator (VCXO, 404) with a specially designed clock recovery phase detector, 402. The detected phase difference is sent to the clock recovery loop filter, 403, which integrates the phase difference. The output of the loop filter is then used to adjust the frequency of the VCXO, 404 to cause it to match the phase and frequency of the incoming data. This system has limited application because it is only capable of recovering a clock over a narrow range of bit rates. If a different bit rate is desired, a VCXO matched to the new rate must be used.

Other known configurations for phase locked loops include those described in U.S. Pat. No. 4,743,867 describing compensation circuitry for dual port phase-locked loops; U.S. Pat. No. 4,755,774 describing a two-port synthesizer modulation system employing an improved reference phase modulator; and U.S. Pat. No. 5,109,531 describing a sideband receiver with pilot lock. However, none of these phase locked loop (PLL) circuits address the stability problem as described above with reference to FIGS. 1 and 4.

SUMMARY OF THE INVENTION

The highly stable frequency synthesizer loop according to the present invention overcomes the stability problem experienced by the known voltage controlled oscillator (VCO) techniques and is utilized to stabilize the output of a VCO. The frequency synthesizer loop according to the present invention allows for a tightly controlled tuning range and a wide modulation bandwidth. The frequency synthesizer loop according to the present invention has applications in communications receivers, such as satellite and land-based microwave receiver tuners and clock recovery circuits.

The frequency synthesizer loop according to the present invention achieves high stability by phase locking a VCO to a highly stable voltage controlled crystal oscillator. The total tuning range is controlled numerically by limiting the divider values in the frequency synthesizer PLL. A high modulation bandwidth for the synthesized output of the VCO is achieved by the use of feedforward.

One frequency synthesizer loop according to the present invention includes a first voltage controlled oscillator for receiving a first voltage; a first divider circuit coupled to an output of the first voltage controlled oscillator for dividing the frequency of a first output signal generated by the first voltage controlled oscillator by a factor of N; a phase/frequency detector circuit having a first input coupled to an output of the first divider circuit; a loop filter circuit coupled to an output of the phase/frequency detector circuit; a feedforward amplifier for receiving and amplifying the first voltage; a summing circuit having a first input coupled to an output of the loop filter circuit and a second input coupled to the output of the feedforward amplifier; a second voltage controlled oscillator having an input coupled to an output of the summing circuit, wherein the second voltage controlled oscillator generates a second output signal in response to a second voltage generated by the summing circuit; and a second divider circuit having an input coupled to an output of the second voltage controlled oscillator, wherein the second divider circuit divides a frequency of the second output signal generated by the second voltage controlled oscillator by a factor of M and has an output coupled to a second input of the phase/frequency detector circuit.

The synthesizer loop according to the present invention may further include a microprocessor for varying the value M in response to the first voltage, such that the microprocessor varies the value of M to keep the first voltage in the middle of a range of the first voltage controlled oscillator.

A receiver according to the present invention includes a first local oscillator for generating a first output signal; a first mixer circuit for mixing a received signal with the first output signal to produce a first intermediate frequency signal; a first filter for filtering the first intermediate frequency signal; a second mixer circuit for mixing an output of the first filter with an output from a first voltage controlled oscillator to produce a second intermediate frequency signal; a second filter for filtering the second intermediate frequency signal; a demodulator circuit for demodulating the second intermediate frequency signal; a carrier phase recovery circuit coupled to the demodulator circuit for determining phase error between the output of a second local oscillator and the second intermediate frequency signal; a first loop filter for generating a first voltage representing the integrated phase error determined by the carrier phase recovery circuit; a second voltage controlled oscillator for receiving the first voltage and generating a second output signal in response to the first voltage; a first divider circuit coupled to an output of the first voltage controlled oscillator for dividing a frequency of a second output signal generated by the second voltage controlled oscillator by a factor of N; a phase/frequency detector circuit having a first input coupled to an output of the first divider circuit; a second loop filter circuit coupled to an output of the phase/frequency detector circuit; a feedforward amplifier for receiving and amplifying the first voltage; a summing circuit having a first input coupled to an output of the second loop filter circuit and a second input coupled to the output of the feedforward amplifier; the first voltage controlled oscillator having an input coupled to an output of the summing circuit, the first voltage controlled oscillator generating a second output signal in response to a second voltage generated by the summing circuit; and a second divider circuit having an input coupled to an output of the first voltage controlled oscillator, the second divider circuit dividing the frequency of the second output signal generated by the first voltage controlled oscillator by a factor of M and having an output coupled to a second input of the phase/frequency detector circuit.

A clock recovery circuit according to the present invention includes a first phase detector for receiving a data input; a loop filter coupled to an output of said first phase detector producing a first voltage; a first voltage controlled crystal oscillator coupled to an output of said loop filter for providing a variable frequency reference; and a synthesizer loop. The synthesizer loop includes a first divider circuit for dividing the output frequency of the first voltage controlled crystal oscillator by a factor of N, a second voltage controlled oscillator, a second divider circuit coupled to the first voltage controlled oscillator for dividing the output frequency of the second voltage controlled oscillator by a factor of M, a phase/frequency detector circuit for comparing the phase of outputs from the first and second divider circuits, thereby determining a phase error, a loop filter for integrating the phase error; and a summing circuit which has as its first input the output of the loop filter. The clock recovery circuit further includes a feedforward amplifier which has as its input the first voltage, wherein the output of the feedforward amplifier is connected to the second input of the summing circuit. The output of the summing circuit produces a second voltage which provides an input to the second voltage controlled oscillator, thereby reducing the phase error in the synthesizer loop. The clock recovery circuit further includes a third divider circuit coupled to the second voltage controlled oscillator for dividing the output frequency of the second voltage controlled oscillator by a factor of A, wherein the output of the third divider is coupled to a second input of the first phase detector. The recovered clock signal is present at the output of the third divider circuit. The clock recovery circuit may also include a microprocessor for varying the divider values M, N and A.

The foregoing and other features, aspects, and advantages of the present invention will become more apparent from the following detailed description when read in conjunction with the accompanying drawings.

DETAILED DESCRIPTION

The frequency synthesizer loop circuit according to the present invention will be described with reference to an 880 MHZ center frequency oscillator. The voltage controlled oscillator (VCO) has a tuning range of ±2.5 MHZ with a frequency stability on the order of 50 parts per million (ppm). However, the frequency synthesizer loop circuit according to the present invention is not limited to this application and may be used in numerous types of circuits.

Figure 2:
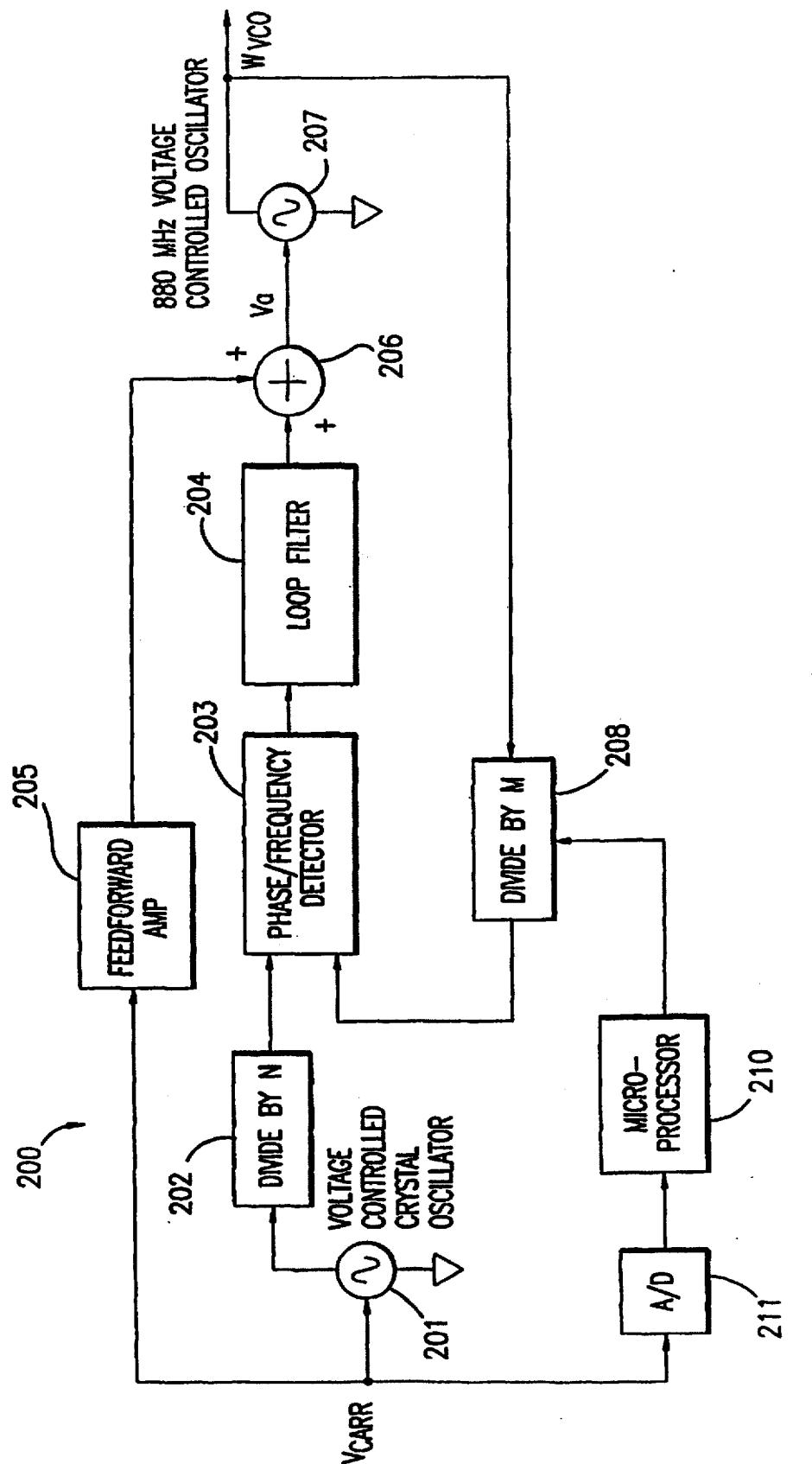
FIG. 2 provides a block diagram of an embodiment of the synthesizer loop according to the present invention.

With reference to FIG. 2, one embodiment of the synthesizer loop 200 according to the present invention includes a voltage controlled crystal oscillator (VCXO) 201, a divider circuit 202; a phase/frequency detector 203; and a loop filter 204. VCXO 201 is a variable frequency voltage controlled crystal oscillator that provides a continually variable (i.e., not fixed or stepped) frequency reference output. As a result, the modulation bandwidth of the synthesizer-controlled VCO is extended down to DC (0 Hz).

VCXO 201 receives an input $V_{carr}$. $V_{carr}$ represents the integrated phase difference between the received signal and the output from a local oscillator, for example, oscillator 310 in FIG. 3. The output of VCXO 201 is input into N-divider circuit 202. The output from N-divider circuit 202 is coupled to a first input of phase/frequency detector circuit 203. The output of phase/frequency detector circuit 203 is input into loop filter 204. The output from the loop filter 204 is coupled to a first input of a summing circuit 206. A feedforward amplifier 205 is coupled across the voltage controlled crystal oscillator 201, the phase/frequency detector 202 and the loop filter 203. $V_{carr}$ is input into the feedforward amplifier 205, and the output of feedforward amplifier 205 is provided to a second input of summing circuit 206. Summing circuit 206 adds the outputs from the loop filter 204 and provides the summed output to the input of a voltage controlled oscillator (VCO) 207, such as the 880 MHZ VCO shown in FIG. 2. The output from the summing circuit 206 to the VCO 207 provides a control signal $V_c$ for adjusting the output of the VCO 207. The output $\omega_{vco}$ from the VCO 207 is provided to an M-divider circuit 208 which divides the frequency by a factor of M and provides the divided frequency to a second input of phase/frequency detector 203. The phase/frequency detector 203 compares the inputs from divider circuit 208 and divider circuit 202, and the loop filter 204 integrates the comparison results into a voltage signal. A microprocessor 210 receives the $V_{carr}$ input via an analog-to-digital converter 211 and controls the value M of the divider circuit 208.

The operation of the synthesizer loop 200 of FIG. 2 will now be described. The synthesizer loop causes the frequency of the VCO 207 to be equal to M/N times the frequency of the VCXO 201. The VCXO 201 has a tightly controlled nominal frequency and a small tuning range. In contrast, the VCO 207 has a more loosely controlled nominal frequency and a relatively large tuning range. By using a synthesizer loop, the nominal frequency of the VCO 207 is tightly controlled. It is set by the accuracy of the VCXO 201. By using the VCXO 201 as the reference to the synthesizer, the output frequency may be continuously varied by varying the VCXO frequency. In many applications such as the carrier recovery loop of FIG. 3 and the clock recovery loop of FIG. 5, the frequency response from tuning voltage, $V_{carr}$ in FIG. 2 and $V_{clk}$ in FIG. 5, to the VCO frequency must extend from DC (0 Hz) to a frequency higher than the synthesizer loop bandwidth. The use of feedforward according to the present invention extends the high frequency tuning response. The use of the VCXO 201 as a reference (variable frequency reference) according to the present invention provides the necessary DC and low frequency response.

Thus, a synthesizer with a variable frequency reference and feedforward is employed to achieve a modulation bandwidth whose low frequency response extends to DC and whose high frequency response is not limited by the synthesizer loop bandwidth.

The system of FIG. 2 achieves a wide tuning range with the variable reference frequency synthesizer. With M and N in FIG. 2 held constant, the VCO frequency, $\omega_{vco}$, has a very small tuning range. In order to extend the tuning range, the tuning voltage, $V_{carr}$, is digitized and monitored with a microprocessor 210. If $V_{carr}$ is close to its limits, the microprocessor 210 will re-adjust M and N to cause $V_{carr}$ to move closer to its nominal value. This requires that the tuning range of the VCXO 201 be greater than $(N*\omega_{vco})/(M*(M+1))$. This relationship is necessary for the VCXO to have sufficient range to overlap each step of M. The tuning range may be tightly controlled by limiting the permissible ranges for M and N.

Otherwise stated, in the synthesizer loop circuit Of FIG. 2, a divided down version of the VCO 207 is phase locked to a highly stable reference (VCXO 201) to produce a variable high frequency oscillator with good frequency stability. This produces an oscillator having a set of discrete output frequencies to which it can tune. The use of a VCXO 201 as the reference oscillator enables the VCO 207 to generate a continuously variable output frequency $\omega_{vco}$. In order to achieve a wide tuning range, the control voltage $V_{carr}$ is digitized by analog-to-digital converter 211 and monitored by microprocessor 210 which adjusts the VCO divider value M to keep $V_{carr}$ in the middle of its range. The tuning range is then limited by programming the microprocessor 210 to limit the range of values for M. By choosing a frequency step size for the synthesizer loop that is smaller than the pulling range of the VCXO 201, there will not be any gaps in the tuning range of the system.

In order to insure that the carrier recovery phase locked loop will not experience cycle slips when the synthesizer divider value M is changed, the synthesizer loop bandwidth must be set much lower than the bandwidth of the carrier recovery loop. As a result, the synthesizer loop responds slowly to changes in M, and the carrier recovery loop is able to track out any disturbances caused by the change in M. When the dynamics of the carrier recovery loop are examined, it is apparent that the transfer function from $V_{carr}$ to the VCO output frequency, $\omega_{vco}$, appears in the open loop response of the carrier recovery loop. If the synthesizer loop 200 is implemented without a feedforward path, for example, through feedforward amplifier 205, then the transfer function $\omega_{vco}(s)/V_{carr}(s)$ will be low pass in nature and will cause instability in the carrier recovery loop.

The synthesizer loop 200 shown in FIG. 2 uses a feedforward path to allow high frequency signals from the carrier recovery loop filter to be presented directly to the 880 MHZ VCO. By correctly choosing the gain of the feedforward path, the transfer function $\omega_{vco}(s)/V_{carr}(s)$ remains constant well past the bandwidth of the carrier recovery loop. This approach allows the synthesizer to respond slowly to changes in M while responding quickly to changes in $V_{carr}$.

Figure 1:
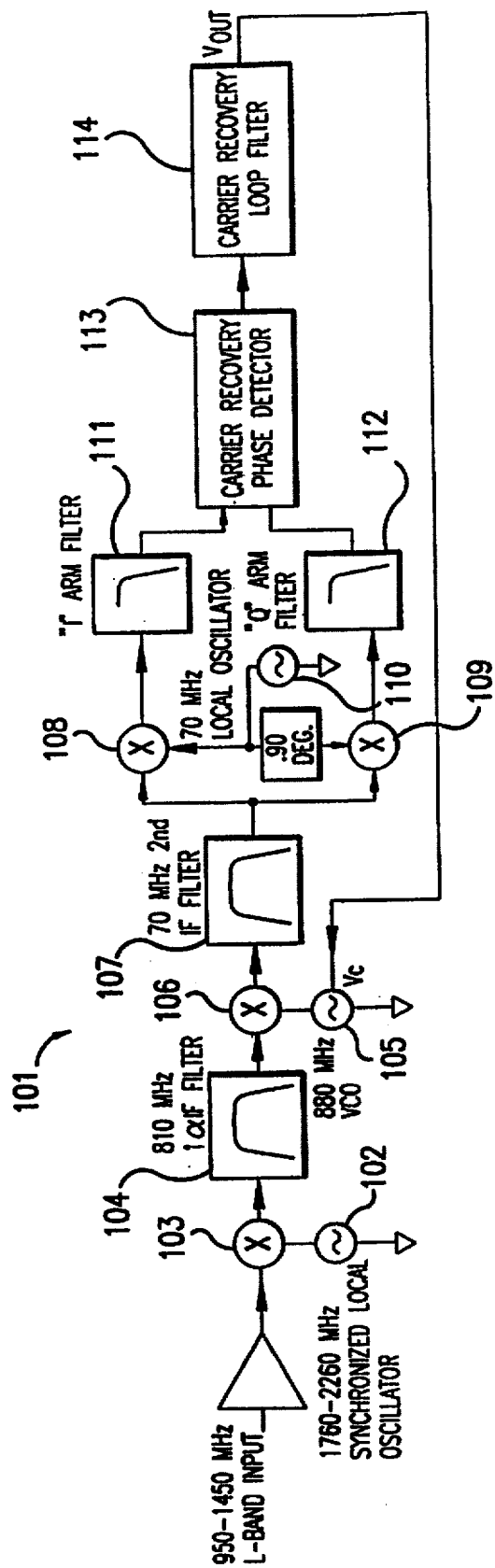
FIG. 1 provides a block diagram of a known PLL circuit.
Figure 3:
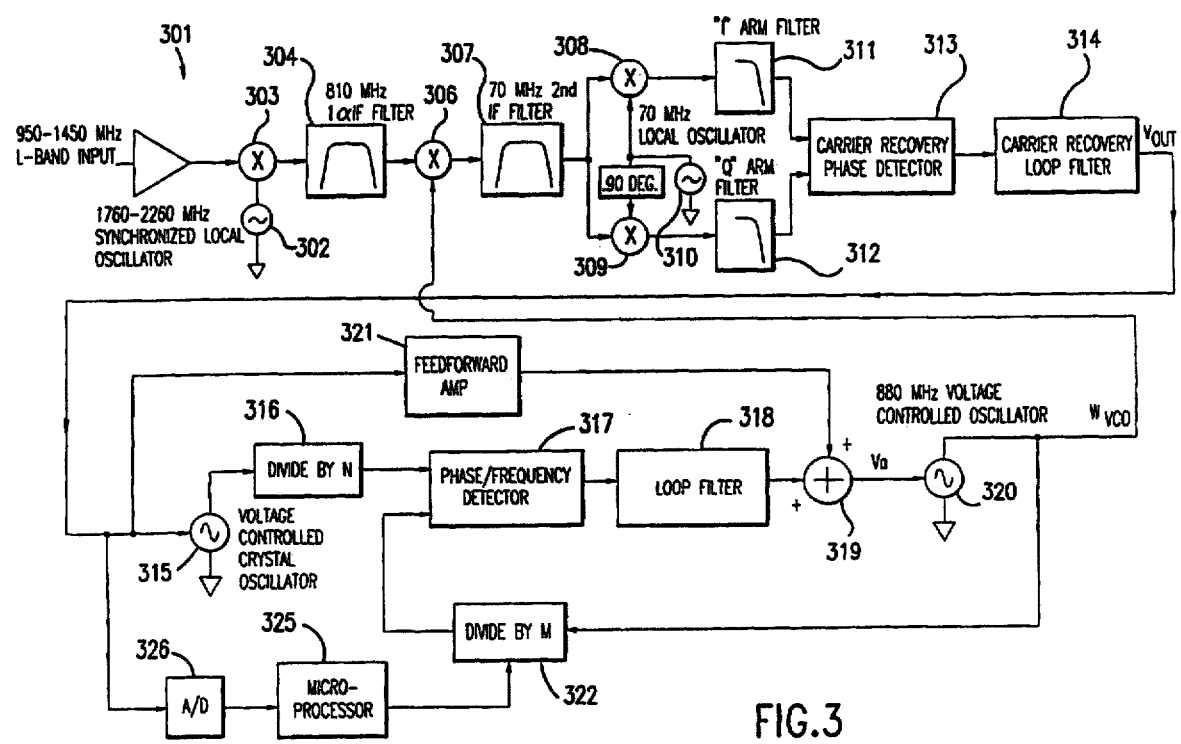
FIG. 3 provides a block diagram of a receiver in which the synthesizer loop according to the present invention is utilized.
Figure 4:
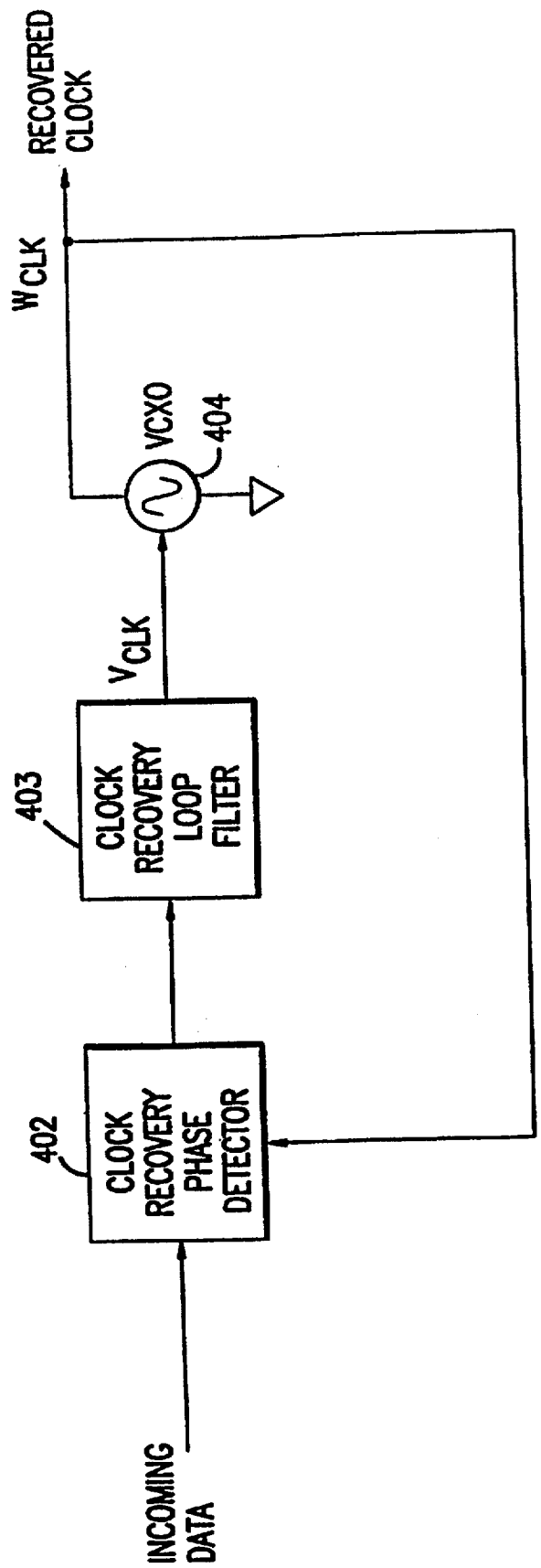
FIG. 4 provides a block diagram of a known phase locked loop clock recovery circuit.

FIG. 3 provides a block diagram of a receiver 301 including the frequency synthesizer loop according to the present invention. The synthesizer loop and VCO may replace the local oscillator (LO) in the tuner of a receiver such as the quadrature phase shift keyed (QPSK) receiver shown in FIG. 1.

The receiver in FIG. 3 includes a VCO circuit and a loop circuit. The VCO circuit includes a local oscillator (LO) 302, a voltage controlled crystal oscillator 315, a first mixer circuit 303, a first filter 304, a second mixer circuit mixer 306, a second filter 307, a demodulator circuit 308-312, a carrier recovery phase detector circuit 313 and a carrier recovery loop filter 314. The operation of these elements is described above with reference with FIG. 1.

The loop circuit in FIG. 3 includes a voltage controlled oscillator 320, a feedforward amplifier 321, two divider circuits 316 and 322, a phase/frequency detector circuit 317, a loop filter 318, and a summing circuit 319. The divider circuit 320, phase/frequency detector circuit 317, and the loop filter 318 comprise a phase locked loop. The loop circuit of FIG. 3 also includes a microprocessor 325 which is responsive to the output voltage of the voltage controlled oscillator circuit via an A/D converter 326 and controls the divider circuit 322 within the phase locked loop.

The operation of the elements of the loop circuit is described above with reference to FIG. 2. The receiver circuit resulting from the combination of the VCO circuit and the loop circuit as shown in FIG. 3 has a lightly controlled tuning range and a wide tuning bandwidth desired for various receiver applications.

The synthesizer loop employing feedforward in FIG. 2 has other applications in the design of a communications receiver. If a single conversion tuner is used, the synthesized LO in the tuner may have the configuration shown in FIG. 2. The synthesizer divide ratio is chosen to tune to the desired carrier, and the demodulator tunes the VCXO to achieve phase lock.

Another important function required in a digital receiver is a clock recovery circuit. This circuit is used to regenerate a clock that is phase-locked to the demodulated data. The synthesizer loop with feedforward according to the present invention can be used as the clock in a multiple rate clock recovery circuit. The divide ratio is selected to provide the nominal clock frequency. The clock recovery loop filter then provides a control signal input to the synthesizer loop.

Figure 5:
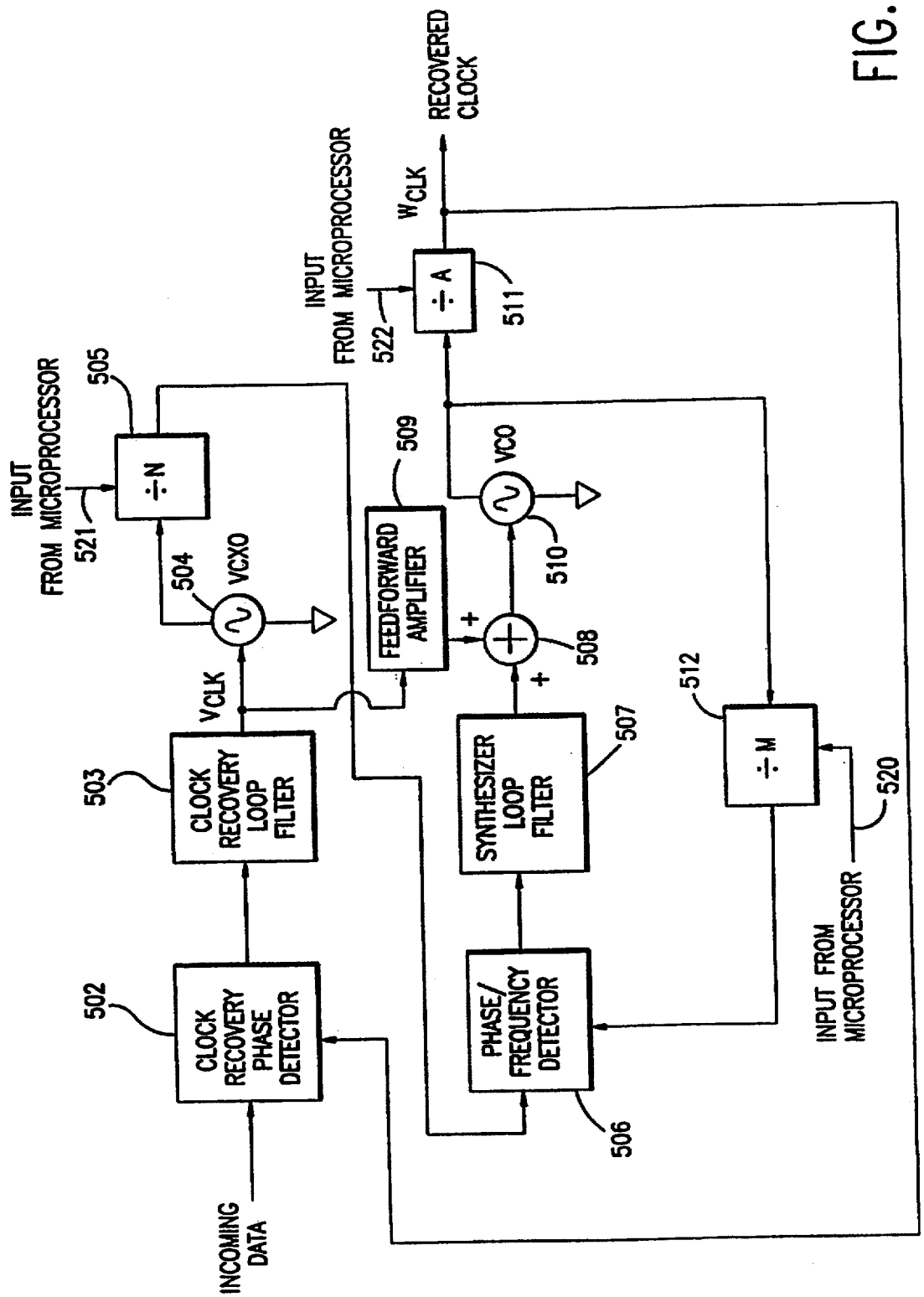
FIG. 5 provides a block diagram of a phase locked loop clock recovery circuit according to the present invention.

One configuration of a clock recovery circuit according to the present invention is shown in FIG. 5. FIG. 5 shows a variable bit rate clock recovery circuit including a clock recovery phase detector, 502 and clock recovery loop filter. A VCXO 504 acts as a variable frequency reference to a synthesizer loop. The synthesizer loop includes a divider circuit 505 which divides the frequency of the VCXO by an integer N; a divider circuit 512 which divides the frequency of a VCO 510 by an integer M; a phase/frequency detector 506 that compares the phase of the output of the two dividers 505 and 512; and a synthesizer loop filter that integrates the phase error and controls the VCO 510 to force the phase error to zero. The synthesizer loop forces the VCO 510 frequency to be equal to M/N times the VCXO 504 frequency. The values M and N are programmed via a microprocessor (not shown). The output of the VCO 510 is also sent to a divider circuit 511 which divides the VCO 510 frequency by an integer A which is also programmable by the microprocessor. The frequency of the recovered clock is then (M/N)/A times the VCXO frequency. This allows the microprocessor to perform coarse adjustment of the clock frequency by setting M, N, and A via inputs 520, 521 and 522. The microprocessor may adjust these values based on user inputs, program, stored data table, or other information sources. Final free tuning of the clock frequency is achieved by the clock recovery loop which adjusts the exact frequency of the VCXO 504.

The feedforward amplifier 509 is used to maintain a high modulation bandwidth for the synthesizer loop even when a relatively low synthesizer loop bandwidth is used. To illustrate the significance of the addition of the feedforward path, the following values are assumed for the circuit of FIG. 5:

VCO tuning range: 16 MHZ to 32 MHZ

VCXO tuning range: +/−2 kHz centered around 16 MHZ

Possible A values: 1, 2, 4, 8, 16, 32

Bit Rate 500 kHz to 32 MHZ

To allow any bit rate within the specified range to be selected, the value of N must be greater than 16 MHZ/2 kHz. This provides the synthesizer loop with a reference frequency of 2 kHz or less. As a result, the synthesizer loop bandwidth must be less than approximately 100 Hz. With the feedforward amplifier in place, the response from $V_{clk}$ to $\omega_{clk}$ is flat with respect to frequency. This allows the clock recovery loop bandwidth to be chosen independently and optimized for best acquisition and tracking performance. In contrast, if the feedforward path is omitted, the clock recovery loop bandwidth will need to be lower by another factor of 10, or approximately 10 Hz, because the transfer function from $V_{clk}$ to $\omega_{clk}$ would be lowpass in nature with a bandwidth of around 100 Hz. This low value of clock recovery loop bandwidth may cause the loop not to acquire lock.

Thus, the clock recovery circuit of the present invention as shown in FIG. 5 employs a synthesizer with programmable dividers for coarse adjustments and a variable frequency reference for fine adjustment of the clock. The clock recovery circuit according to the present invention also uses feedforward to allow independent adjustment of the synthesizer loop bandwidth and the clock recovery loop bandwidth. Furthermore, like the carrier recovery circuits shown in FIGS. 2 and 3, the clock recovery circuit of FIG. 5 combines the use of a synthesizer with a variable frequency reference with feedforward to increase the modulation bandwidth.

While the present invention has been particularly described with reference to the preferred embodiments, it should be readily apparent to those of ordinary skill in the art that changes and modifications in form and details may be made without departing from the spirit and scope of the invention. It is intended that the appended claims include such changes and modifications.

We claim:

1. A highly stable frequency synthesizer loop for use in a carrier recovery circuit, comprising:

a first voltage controlled oscillator for receiving a first voltage output of said carrier recovery circuit;

a first divider circuit coupled to an output of said first voltage controlled oscillator for dividing a frequency of a first output signal generated by said first voltage controlled oscillator by a factor of N;

a phase/frequency detector circuit having a first input coupled to an output of said first divider circuit;

a loop filter circuit coupled to an output of said phase/frequency detector circuit;

a feedforward amplifier for receiving and amplifying said first voltage output of said carrier recovery circuit and directly feeding forward high frequency signals, the gain of the feedforward path to a second voltage controlled oscillator being predetermined such that the transfer function between the output of said first voltage controlled oscillator and said first voltage output of said carrier recovery circuit remains constant past the bandwidth of said carrier recovery circuit;

a summing circuit having a first input coupled to an output of said loop filter circuit and a second input coupled to an output of said feedforward amplifier;

said second voltage controlled oscillator having an input coupled to an output of said summing circuit, said second voltage controlled oscillator generating a second output signal in response to a second voltage generated by said summing circuit; and a second divider circuit having an input coupled to an output of said second voltage controlled oscillator, said second divider circuit dividing a frequency of said second output signal generated by said second voltage controlled oscillator by a factor of M and having an output coupled to a second input of said phase/frequency detector circuit.

2. A frequency synthesizer loop according to claim 1, wherein said first voltage controlled oscillator is a voltage controlled crystal oscillator which generates a continually variable frequency output.

3. A frequency synthesizer loop according to claim 1, wherein said first voltage output of said carrier recovery circuit represents a phase difference between a received signal and a signal generated by a local oscillator of said carrier recovery circuit.

4. A frequency synthesizer loop according to claim 1, further comprising a microprocessor for varying the value M in response to said first voltage output of said carrier recovery circuit, said microprocessor varying the value of M to keep said first voltage output of said carrier recovery circuit in the middle of a range of said second voltage controlled oscillator.

5. A tuner circuit comprising:

a voltage controlled oscillator circuit, said voltage controlled oscillator circuit comprising a first voltage controlled oscillator, a carrier recovery circuit and a second local oscillator; and a loop circuit, responsive to an output of said voltage controlled oscillator circuit and including a third voltage controlled oscillator, said loop circuit comprising a feedforward amplifier for directly feeding forward the output voltage of the voltage controlled oscillator circuit toward the third voltage controlled oscillator, the gain of the feedforward path being chosen such that the transfer function between the output of the third voltage controlled oscillator and the output voltage of the voltage controlled oscillator circuit remains constant past the bandwidth of said loop circuit and a processor, responsive to the output voltage of the voltage controlled oscillator circuit, for controlling a divider circuit of a phase lock loop for controlling the third voltage controlled oscillator.

6. A tuner circuit according to claim 5, wherein said first voltage controlled oscillator is a voltage controlled crystal oscillator which generates a continually variable frequency output.

7. A tuner circuit according to claim 5, wherein said phase lock loop further comprises a phase/frequency detector circuit coupled to an output of said divider circuit and a loop filter circuit having an input coupled to an output of said phase/frequency detector.

8. A tuner for use in a communication system receiver, comprising:

a first local oscillator for generating a first output signal;

a first mixer circuit for mixing a received signal with said first output signal to produce a first intermediate frequency signal;

a first filter for filtering said first intermediate frequency signal;

a second mixer circuit for mixing said filtered first intermediate frequency signal with a second output signal from a first voltage controlled oscillator to produce a second intermediate frequency signal;

a second filter to filter said second intermediate frequency signal;

a demodulator circuit for demodulating said second intermediate frequency signal;

a carrier phase recovery circuit coupled to said demodulator circuit for determining a phase error between a second local oscillator and said second intermediate frequency signal;

a first loop filter for generating a first voltage representing said phase error determined by said carrier phase recovery circuit;

a second voltage controlled oscillator for receiving said first voltage and generating a third output signal in response to said first voltage;

a first divider circuit coupled to an output of said second voltage controlled oscillator for dividing a frequency of said third output signal generated by said second voltage controlled oscillator by a factor of N;

a phase/frequency detector circuit having a first input coupled to an output of said first divider circuit;

a second loop filter circuit coupled to an output of said phase/frequency detector circuit;

a feedforward amplifier for receiving and amplifying said first voltage and directly feeding said first voltage forward, said feedforward amplifier having a gain chosen according to a transfer function that remains constant past the bandwidth of said carrier phase recovery circuit and said first loop filter;

a summing circuit having a first input coupled to an output of said second loop filter circuit and a second input coupled to an output of said feedforward amplifier;

said first voltage controlled oscillator having an input coupled to an output of said summing circuit, said first voltage controlled oscillator generating said second output signal in response to a second voltage generated by said summing circuit; and a second divider circuit having an input coupled to an output of said first voltage controlled oscillator, said second divider circuit dividing a frequency of said second output signal generated by said first voltage controlled oscillator by a factor of M and having an output coupled to a second input of said phase/frequency detector circuit.

9. A tuner according to claim 8, wherein said first voltage controlled oscillator is a voltage controlled crystal oscillator which generates a continually variable frequency output.

10. A tuner according to claim 8, further comprising a microprocessor for varying the value M in response to said first voltage, said microprocessor varying the value of M to keep said first voltage in the middle of a range of said second voltage controlled oscillator.

11. A clock recovery circuit for receiving a data input and outputting a recovered clock signal, comprising:

a first phase detector for receiving a data input;

a first loop filter coupled to an output of said first phase detector for producing a first voltage;

a first voltage controlled crystal oscillator coupled to an output of said loop filter for providing a variable frequency reference;

a synthesizer loop, said synthesizer loop comprising a first divider circuit for dividing the output frequency of said first voltage controlled crystal oscillator by a factor of N, a second voltage controlled oscillator, a second divider circuit coupled to said second voltage controlled oscillator for dividing an output frequency of said second voltage controlled oscillator by a factor of M, a phase/frequency detector circuit for comparing the phase of outputs from said first and second divider circuits, thereby determining a phase error, a second loop filter for integrating the phase error and outputting a corresponding control signal to said second voltage controlled oscillator, thereby reducing said phase error, and a summing circuit having as a first input the output of said second loop filter;

a feedforward amplifier having an input coupled to said output of said first loop filter for receiving said first voltage and an output coupled to a second input of said summing circuit, said summing circuit summing said control signal from said second loop filter and said output from said feedforward amplifier and providing a summed control signal to said second voltage controlled oscillator; and a third divider circuit for dividing an output of said second voltage controlled oscillator by a factor of A, an output from said third divider circuit coupled to a second input of said first phase detector circuit.

12. A clock recovery circuit according to claim 11, further comprising a microprocessor for varying the divider values M, N and A based on information stored in said microprocessor.

* * * * *